US005205902A

United States Patent [19]

Horton et al.

[11] Patent Number: 5,205,902

[45] Date of Patent: Apr. 27, 1993

[54] METHOD OF MANUFACTURING MICROCHANNEL ELECTRON MULTIPLIERS

[75] Inventors: Jerry R. Horton, Cape Elizabeth, Me.; G. William Tasker, West Brookfield, Mass.

[73] Assignee: Galileo Electro-Optics Corporation, Sturbridge, Mass.

[21] Appl. No.: 789,975

[22] Filed: Nov. 12, 1991

Related U.S. Application Data

[62] Division of Ser. No. 395,586, Aug. 18, 1989, Pat. No. 5,086,248.

[51] Int. Cl.[5] .................... H01L 21/306; B44C 1/22; C03C 15/00; C23F 1/00

[52] U.S. Cl. .................... 156/643; 156/644; 156/657; 156/659.1; 156/662; 156/667

[58] Field of Search .............. 156/635, 643, 644, 651, 156/652, 653, 655, 656, 657, 659.1, 661.1, 662, 663, 667; 65/31; 204/192.32, 192.37; 427/38, 39; 250/207; 313/402, 422

[56] References Cited

U.S. PATENT DOCUMENTS

| | | | |
|---|---|---|---|
| 4,217,489 | 8/1980 | Rosier | 313/105 CM |
| 4,577,133 | 3/1986 | Wilson | 313/103 CM |
| 4,589,952 | 5/1986 | Behringer et al. | 156/643 X |
| 4,624,736 | 11/1986 | Gee et al. | 156/635 X |
| 4,624,739 | 11/1986 | Nixon et al. | 156/644 X |
| 4,659,429 | 4/1987 | Isaacson et al. | 156/644 |
| 4,693,781 | 9/1987 | Leung et al. | 156/643 X |
| 4,698,129 | 10/1987 | Puretz et al. | 156/643 X |
| 4,707,218 | 11/1987 | Giammarco et al. | 156/643 X |
| 4,725,332 | 2/1988 | Sphor | 156/644 X |
| 4,734,158 | 3/1988 | Gillis | 156/662 X |
| 4,740,267 | 4/1988 | Knauer et al. | 156/635 |
| 4,764,245 | 8/1988 | Grewal | 156/643 X |
| 4,780,395 | 10/1988 | Saito et al. | 313/103 CM |
| 4,786,361 | 11/1988 | Sekine et al. | 156/345 X |
| 4,790,903 | 12/1988 | Sugano et al. | 156/644 X |
| 4,794,296 | 12/1988 | Warde et al. | 313/103 CM |
| 4,802,951 | 2/1989 | Clark et al. | 156/644 X |
| 4,806,827 | 2/1989 | Eschard | 156/644 X |
| 4,825,118 | 4/1989 | Kyushima | 156/663 X |

FOREIGN PATENT DOCUMENTS 2180986 9/1985 United Kingdom .

OTHER PUBLICATIONS

Lincoln et al., J. Vac. Sci. Technol. B. vol. 1, No. 4, Oct.-Dec. 1983 "Large Area Ion Beam Assisted Etching of GaAs with High Etch Rates and Controlled Anisotrophy".

*Primary Examiner*—William A. Powell
*Attorney, Agent, or Firm*—Watson, Cole, Grindle & Watson

[57] ABSTRACT

A microchannel plate and method is disclosed. In a preferred embodiment the microchannel plate is a water of anisotropically etchable material having been subjected to a directionally applied flux of reactive particles against at least one face of the wafer in selected areas corresponding to microchannel locations. The flux removes material from the selected areas to produce microchannels in the wafer in accordance with the directionality of the applied flux.

26 Claims, 6 Drawing Sheets

METHOD OF MANUFACTURING MICROCHANNEL ELECTRON MULTIPLIERS

This is a division of application Ser. No. 07/395,586 filed Aug. 18, 1989, now U.S. Pat. No. 5,086,248.

BACKGROUND OF THE INVENTION

The invention relates to electron multipliers. In particular, the invention relates to monolithic electron multipliers and microchannel plates (MCP) formed from an isotropic etchable material.

Conventional microchannel plate manufacture relies on the glass multifiber draw (GMD) process. Individual composite fibers, consisting of an etchable soluble barium borosilicate core glass and an alkali lead silicate cladding glass, are formed by drawdown of a rod-in-tube preform, packed together in a hexagonal array, and then redrawn into hexagonal multifiber bundles. These multifiber bundles are next stacked together and fused within a glass envelope to form a solid billet. The billet is then sliced, often at a small angle 8°–15° from the normal to the fiber axes. The resulting wafers are edged and polished into a thin plate. The soluble core glass is then removed by a suitable chemical etchant to produce a wafer containing an array of microscopic channels with channel densities of $10^5$–$10^7/cm^2$. Further chemical treatments followed by a hydrogen reduction process produces a thin wafer of glass containing an array of hollow channels with continuous dynodes of reduced lead silicate glass (RLSG) having conductive and emissive surface properties required for electron multiplication. Metal electrodes are thereafter deposited on the faces of the wafer to complete the manufacture of a microchannel plate.

The GMD method of manufacture described, while satisfactory and economical, suffers from certain disadvantages. For example, the size of the individual channels is governed by at least two glass drawing steps in the manufacturing process. Variations in fiber diameter can cause channel diameter variation, resulting in differential signal gain, both within an MCP and from one MCP to another.

Another disadvantage of current technology concerns channel arrangement. Individual composite fibers are packed in a hexagonal array before redrawing a multifiber bundle. This local array is moderately regular, but variation of fiber size can cause some disorder, and fibers on the periphery of a drawn multifiber bundle are often disordered and dislodged. Further, when these multifibers are stacked and pressed to form a billet there are invariably disruptions in the channel array and distortions in channel cross-section at the boundaries between the multifibers. As a result of these and other processing steps, there is no longrange order in channel location, and channel geometry is not constant across the array.

The manufacture of microchannel plates according to the GMD process is also limited in the choice of materials available. The multifiber drawdown technique demands that the starting materials, namely the core and cladding, both be glasses with carefully chosen temperature-viscosity properties; the fused billet must have properties conducive to wafering and finishing; core material must be preferentially etched over the cladding with very high selectivity; the clad material must ultimately exhibit sufficient surface conductivity and secondary electron emission properties to function as a continuous dynode for electron multiplication. This set of constraints greatly limits the range of materials suitable for manufacturing MCPs with the present technology.

Multi-component alkali lead silicate and barium borosilicate glasses are typically used as the cladding and core materials, respectively, in manufacturing MCPs. To obtain satisfactory continuous dynode action with present materials, the ratio (α) of channel length (L) to channel diameter (D) is typically 40 or more. This aspect ratio is routinely achieved in conventional MCPs by virtue of the extremely high etch selectivity between core and cladding material. However, the difficulties of constructing such a substrate become more critical as the channel diameter and pitch (center to center spacing) of the channels is reduced to below 10 microns.

Attempts have been made to crystallize a photosensitive glass in a lithographically-defined pattern so as to render the crystallized regions selectively etchable from the glass leaving behind an array of channels for producing a microchannel plate. However, only moderate etch selectivity between the crystalline and glass phases yields through channels with non-parallel side walls and limits the minimum channel diameter to about 25 μm. Moreover, the formation of a two-layer secondary emissive and conductive surface in the microchannels is accomplished by a number of cumbersome and difficult steps.

Attempts have also been made in selectively etching a silicon wafer sliced with a set of its crystalline (111) planes normal to the (110) faces of the slice. However, simple holes with vertical side walls extending through the wafer cannot be achieved due to well-known crystallographic constraints.

SUMMARY OF THE INVENTION

The present invention is designed to overcome the limitations and disadvantages of the described prior arrangements. In particular, and in accordance with a preferred embodiment of the invention, there is disclosed an electron multiplier in the form of a microchannel plate comprising a wafer of etchable material having been subjected to a directionally applied flux of reactive particles against at least one face of the wafer in selected areas corresponding to microchannel locations. The active species may be energetic and/or chemically active. The directionally applied flux species removes material from the selected areas exposed thereto to produce microchannels in the wafer oriented in accordance with the directionality of the applied flux.

In one embodiment of the invention the microchannels are etched through from one face of the wafer to the other or from both faces. In another embodiment of the invention the microchannels are etched to a selected depth within the wafer and material from the opposite face is ground or removed to a depth sufficient to expose the ends of the channel within the wafer.

In accordance with the invention, channel etching selectivity is achieved by applying an etch mask to at least one face of the wafer exposed to the flux. In one embodiment the etch mask may be a photosensitive polymer which has been processed to establish a pattern of microchannel locations. In another embodiment the mask may be a metallized etch resist or a chemically durable film deposited or grown on the wafer and then apertured photolithographically to define microchannel locations.

The channels may be activated to exhibit secondary emission and a current carrying capacity sufficient to replenish emitted electrons and to establish a field for accelerating the emitted electrons. The activation may be achieved by the various techniques including forming an active layer or a continuous dynode on the channel walls by chemical vapor deposition (CVD), liquid phase deposition (LPD) and native growth by reaction with a reactive species. Activation may also include doping the film with species to control surface conductivity and secondary electron emission.

In accordance with the present invention major transverse channel dimensions (e.g. diameters) less than about 4 $\mu m$ and having a pitch less than about 6 $\mu m$ are readily achieved. Thin films for channel activation range in thickness over about 2-1000 nm. In exemplary embodiments, a thin film for a continuous dynode on a dielectric substrate has a thickness of 300 nm, whereas a film for a semiconductor substrate has a thickness of 20 nm. Also, channel walls are virtually parallel as a result of the directionality of reactive particle etching.

Various materials may be used for the microchannel plate according to the present invention, including semiconductors such as GaAs, GaP, InP, AlAs, AlSb, Si, substantially single component dielectrics such as $Si_3N_4$, AlN, $Al_2O_3$, $SiO_2$ glass, and $R_2O$-BaO-PbO-$SiO_2$ glasses (where R is one or more of the following: Na, K, Rb, Cs). Other embodiments of the invention include process steps and resulting microchannel plate configurations which include channels of different shapes and sizes and channels with axes in parallel and intersecting planes and trenched channels.

DESCRIPTION OF THE PREFERRED EMBODIMENT

Figure 1:
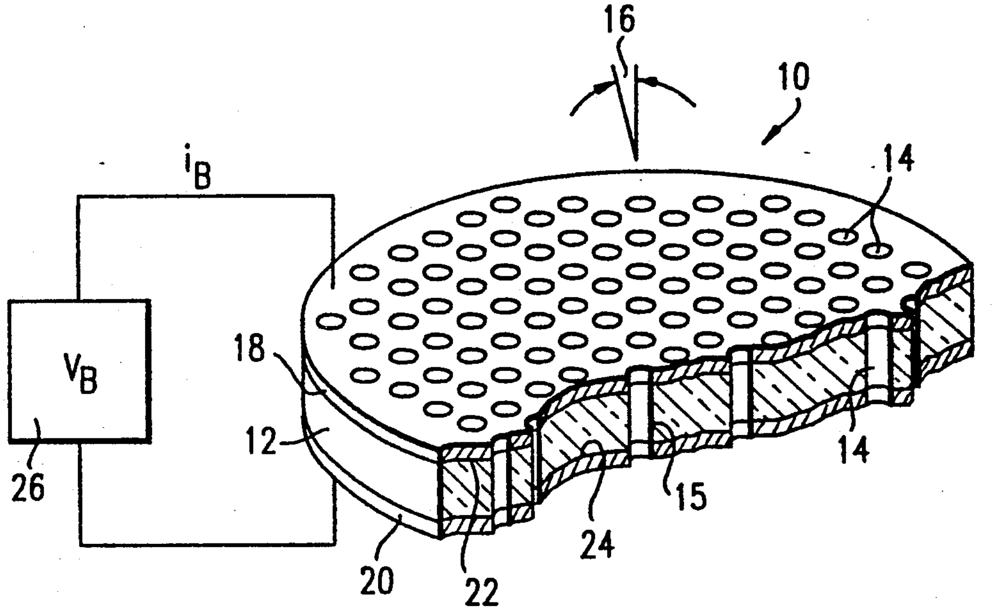
FIG. 1 is a fragmentary perspective view of a microchannel plate in accordance with the present invention.

An MCP 10 fabricated in accordance with the present invention is illustrated in FIG. 1. The MCP 10 may be in the form of a wafer 12 formed of a generally homogenous, etchable material. Such materials include semiconductive materials, including but not limited to GaAs, GaP, InP, AlAs, AlSb, Si, single component dielectrics such as $Si_3N_4$, AlN, $Al_2O_3$, $SiO_2$ glass, and multicomponent dielectrics such as $R_2O$-BaO-PbO-$SiO_2$ glasses (where R is one or more of the following: Na, K, Rb, $C_3$). The wafer 12 is sliced in a manner which can be independent of the crystallographic planes of a crystalline wafer material.

In a preferred embodiment microchannels 14 are formed in the wafer 12 in an array as shown at a bias angle 16. Thin film dynode 15, formed of semiconductive and emissive layers for a thin film dynode on dielectric substrate; or emissive layer on semiconductive substrate, may be deposited or grown on the walls of the channels 14 by various methods such as set forth in the copending application of Tasker et al., Ser. No. 395,588, filed on even date herewith, and commonly assigned to the assignee herein. Conductive electrodes 18 and 20 are formed on the respective opposite faces 22 and 24 of the wafer as shown. In operation, a bias voltage ($V_B$) and current ($i_B$) is supplied across the electrodes 18 and 20 by a source 26 which is illustrated schematically.

Figure 2A:
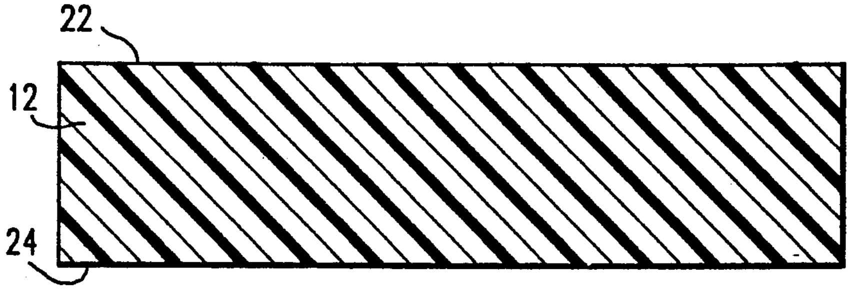
FIGS. 2A-2D illustrate in step wise fashion a preferred embodiment of the process according to the present invention.
Figure 2B:
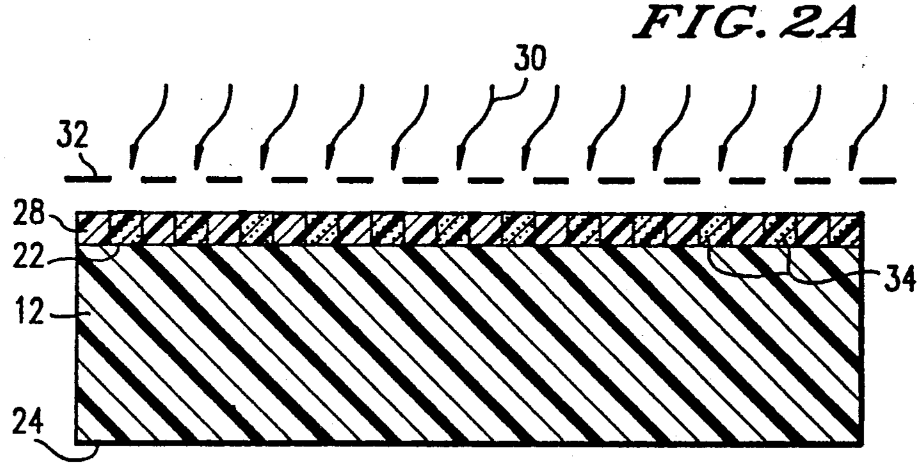

The microchannels 14 are formed in the wafer 12 at the bias angle 16 by an anisotropic etching process which is illustrated schematically in FIGS. 2A-2D. In FIG. 2A, the wafer 12 may be prepared by various known techniques such as slicing it from a bulk homogeneous material (not shown) or by growing it and thereafter polishing and cleaning the surfaces 22 and 24. Such a material may be a single crystalline, polycrystalline or amorphous structure. In preparation for etching in FIG. 2B at least one face 22 of the wafer 12 is masked with a coating 28 which may be a photosensitive polymer material. The coating 28 is selectively exposed to light 30 through an apertured mask 32 to produce a pattern of exposed areas 34 on the coating 28 which correspond to the desired pattern of microchannels. The exposed areas 34 of the coating 28 may thereafter be removed by a developing procedure (FIG. 2B) thereby forming apertures 36 in the coating 28 (FIG. 2C) which expose selected portions of the surface 22 of the wafer 12. The masked wafer 12 is subjected to a directionally applied flux of reactive particles 38 (FIG. 2C) which attacks the substrate material comprising the wafer 12 through the aperatures 36 in the coating 28 to thereby form the microchannels 14. The coating 28 is thereafter removed, the channels are activated, thereafter electrodes 18, 20 may be applied to the faces 22, 24 of the wafer 12 resulting in a microchannel plate 40 shown in FIG. 2D.

Figure 3A:
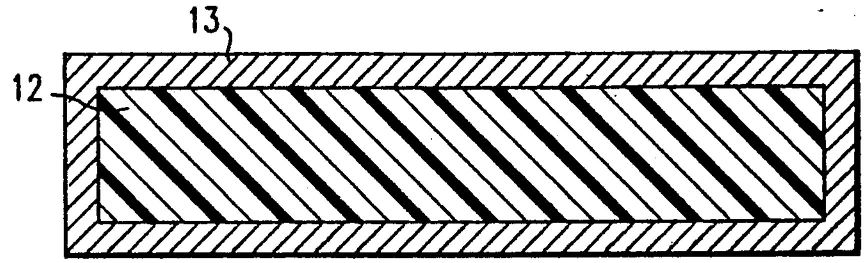
FIGS. 3A-3D illustrate in step wise fashion an alternative embodiment of the process according to the present invention employing a chemically durable etching mask.
Figure 3B:
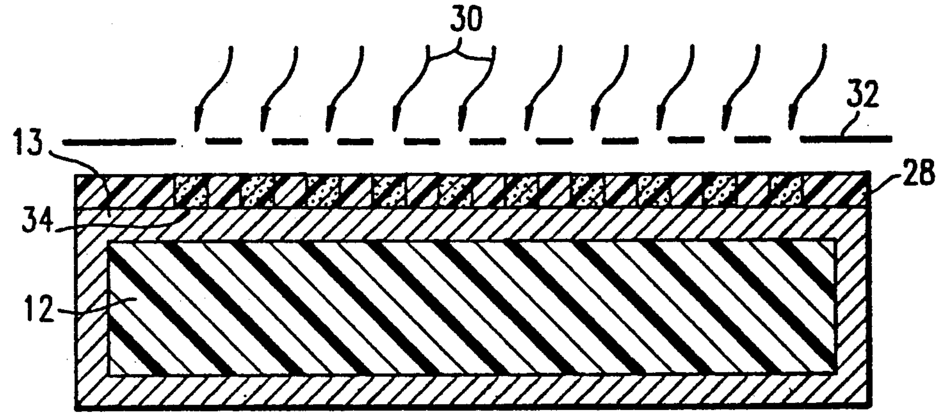
Figure 3C:
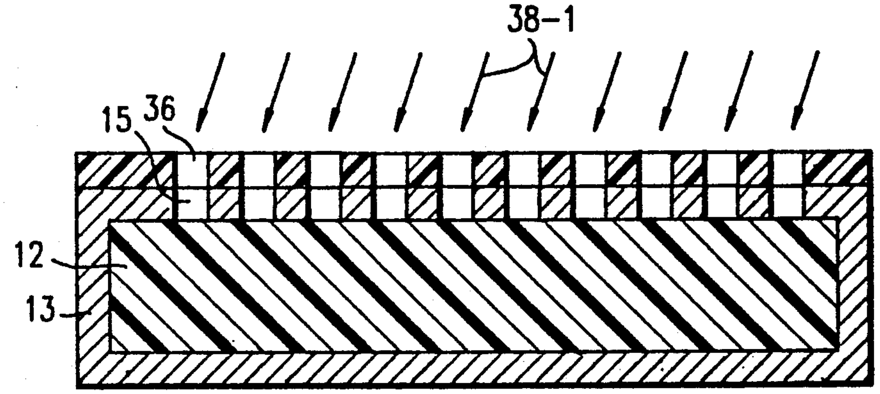
Figure 3D:
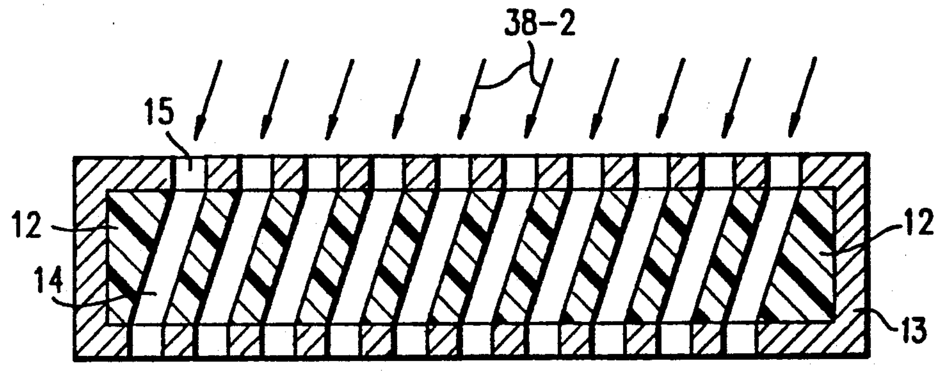

Alternatively, for certain substrates 12, e.g. silicon, the coating 28 fcrming the etch mask may be formed by an oxidation process or deposition process illustrated in FIGS. 3A-3D. In the arrangement illustrated, the wafer 12 is formed as noted and subjected or exposed to oxygen at elevated temperatures to produce a hard silicon oxide coating 13 illustrated in FIG. 3A. Thereafter the wafer 12 and silicon oxide coating 13 receive a coating of photopolymer 28 which is exposed through the photomask 32 by light 30 for producing exposed areas 34 (FIG. 3B) which are developed as noted above, thereby resulting in an etch mask 28 having apertures 36 therein (FIG. 3C). A first flux of reactive particles 38-1 is applied to the wafer 12 for producing apertures 15 in the oxide layer 13 as shown. Thereafter, the photomask 28 is removed and a second flux of reactive particles 38-2 is applied against the wafer through the apertured oxide mask 13 for producing the channels 14. The oxide mask 13 is more durable than photopolymer materials and thus allows for relatively deep channel formation in the substrate 12 as shown in FIG. 3D. Thereafter the apertured wafer 12 may be electroded. The etching fluxes 38-1 and 38-2 may be the same or different particles operating under various conditions as necessary. For example, a relatively high intensity flux 38-1 may be applied to make the apertures 15 in the silicon oxide film 13 while a flux of a different energy 38-2 may be applied for producing the channels 14. It is also possible that the polymer coating 28 may serve as a mask for chemical wet etch or dry etch step whereby the apertures 15 are formed in the silicon oxide layer 13. Alternatively, an etch mask may be formed of some other chemically durable material, for example, $Si_3N_4$ or $Al_2O_3$ by native growth, CVD, LPD or other method as desired.

Figure 2C:
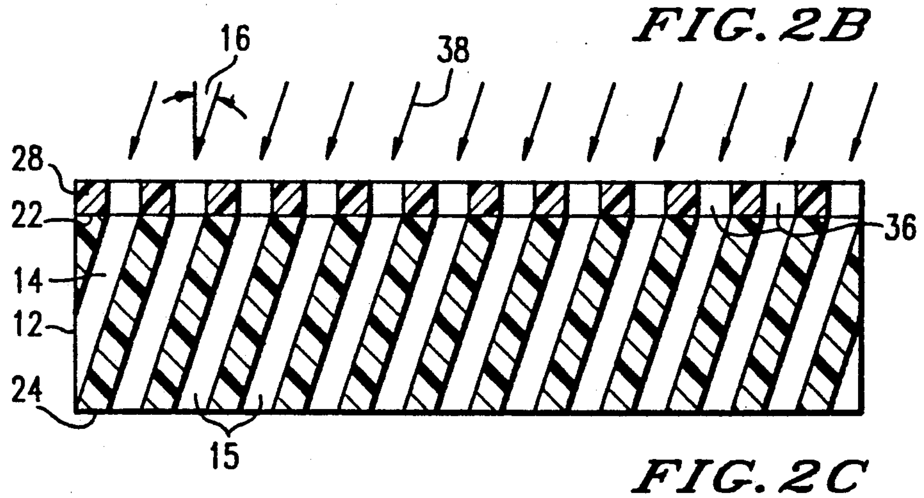
Figure 2D:
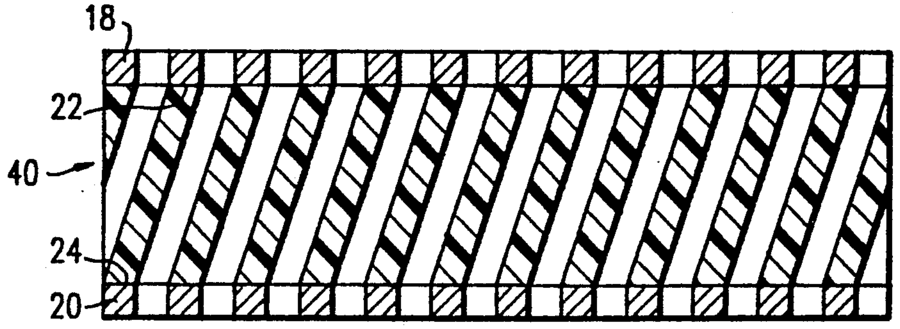
Figure 4:
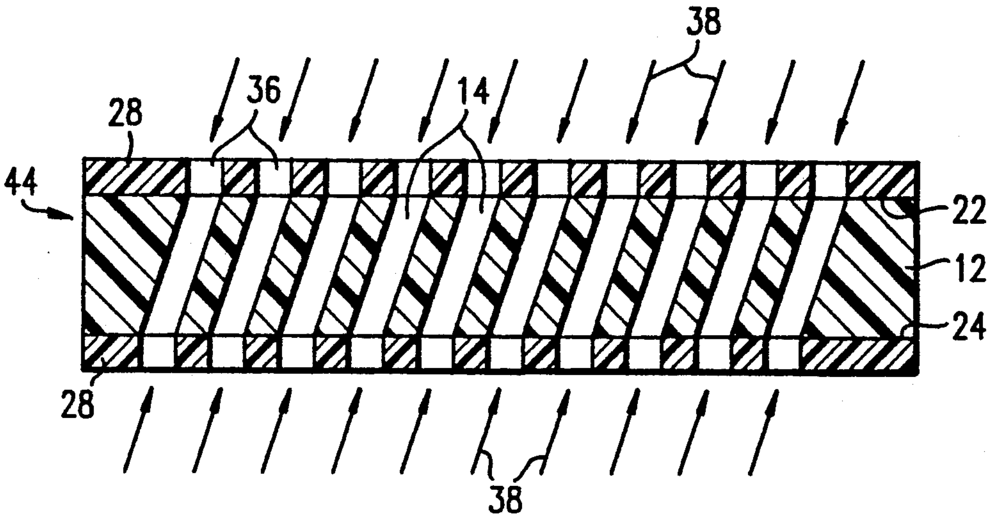
FIGS. 4 and 5 illustrate alternative embodiments of the process according to the present invention.

If desired, and as shown in FIG. 4, an etch resistant metal coating 28 of W, Ni or Cr may be applied to either or both sides 22,24 of the wafer 12 by sputtering evaporation or other method. The coating 28 may be subjected to photolithographic processes and subsequent development to produce apertures 36 and may thus serve as a durable mask for the wafer 12 during the channel 14 etching step with applied flux of particles 38 (FIG. 2C). If desired, such a coating may serve as an electrode for the MCP 44.

Etching may be accomplished by a direction-specific ion beam and/or glow discharge. The ion beam may be produced as set forth in the publication entitled "Large Area Ion Beam Assisted Etching of GaAs with High Etch Rates and Controlled Anisotrophy", Lincoln et al., J. Vac. Sci. Technol B., Vol. 1, No. 4, Oct–Dec. 1983. Etching may also employ various reactive species. The particular species is selected taking into account the type of etching process and the substrate to be etched.

It should be understood that the microchannels 14 may be etched in accordance with the teachings of the present invention for a time sufficient to establish the channels from one face 22 of the wafer 12 to the opposite face 24 as shown in FIG. 2C. It is also possible to etch straight through channels 14 from both sides 22,24 of the wafer as illustrated in FIG. 4; or it is possible to etch chevron, and one-to-many channels by two-faced etching hereinafter described.

Figure 5:
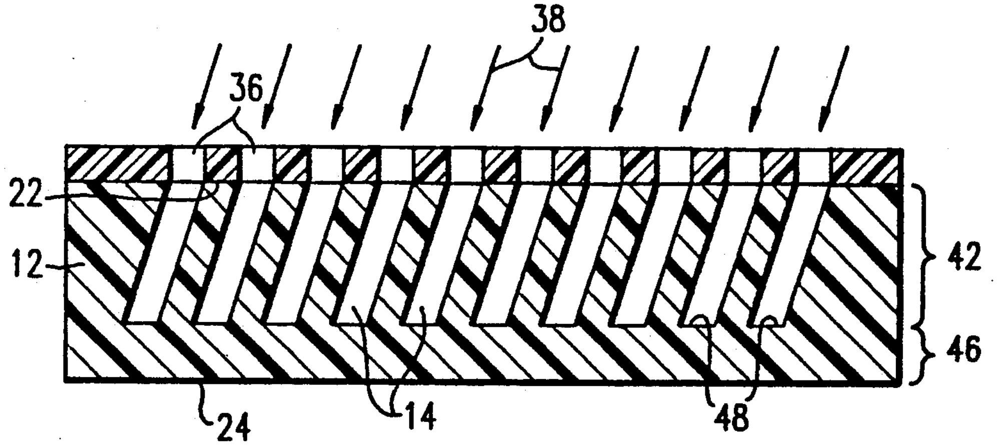

It is also within the teachings of the present invention to terminate the etching step at a given depth 42 as more clearly illustrated in FIG. 5. Excess material 46 beyond the terminal ends 48 of the channels 14 within the wafer 12 may be removed by grinding, polishing, wet isotropic etch, plasma etch or by ion milling.

Figure 6:
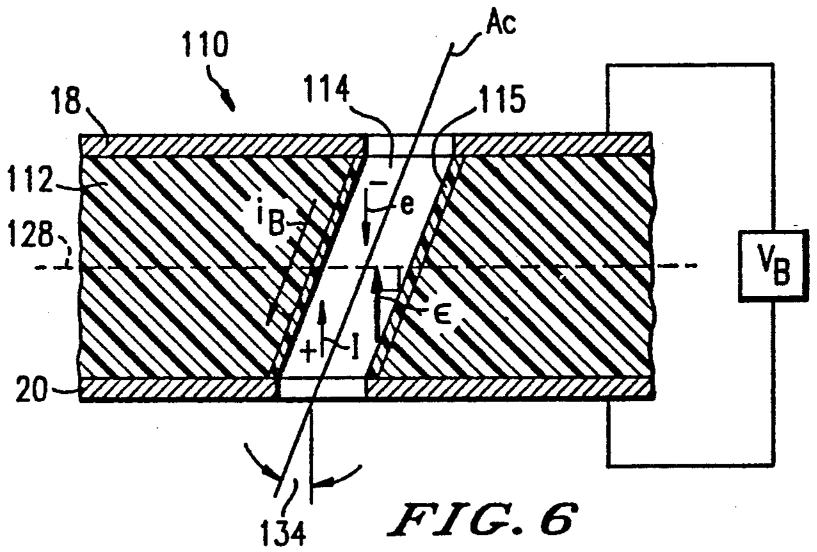
FIG. 6 is a fragmentary detail of a MCP according to the present invention with a semiconductive substrate.

According to an embodiment of the present invention, in the MCP 110 shown in FIG. 6, the wafer 112 may be made of a bulk semiconductor for carrying current $i_B$. The channels 114 formed therein have an emissive 115 layer formed therein. In the case of a semiconductor wafer 112, improved electron multiplication behavior and reduction of ion feedback may be achieved. The electric field normal to the wafer midplane 128 and inclined with an angle 134 with respect to the channel axis Ac allows multiplication of electrons but reduces ion feedback noise preventing energetic positive ions I from impacting the channel wall near the input face of the MCP 110.

Figure 7:
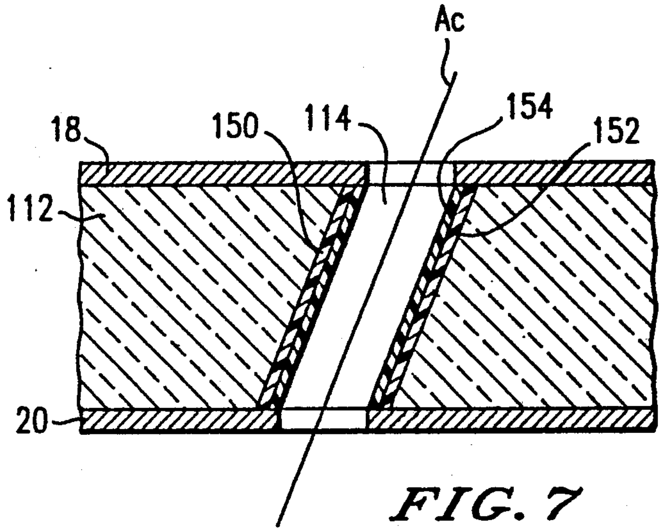
FIG. 7 is a fragmentary detail of a MCP according to the present invention having a dielectric substrate etched in accordance with the teachings of the present invention and having a dynode produced by CVD processing.

In another embodiment, a single component dielectric substrate 112 such as silica glass as shown in FIG. 7 may be etched in accordance with the teachings of the present invention to produce microchannels 114 therein. Thereafter a current carrying, semiconductive coating 152 may be first deposited on the channel walls as shown and emissive coating 154 may be deposited or grown over the current carrying layer 152. As used herein a single component dielectric is a material which is substantially a single component and conventional adjuvants. Deposition of the coatings 152 and 154 may be by various chemical vapor deposition (CVD) techniques typically at reduced pressure and at elevated temperatures to thereby produce the continuous dynode 150 or by other techniques.

Figure 8:
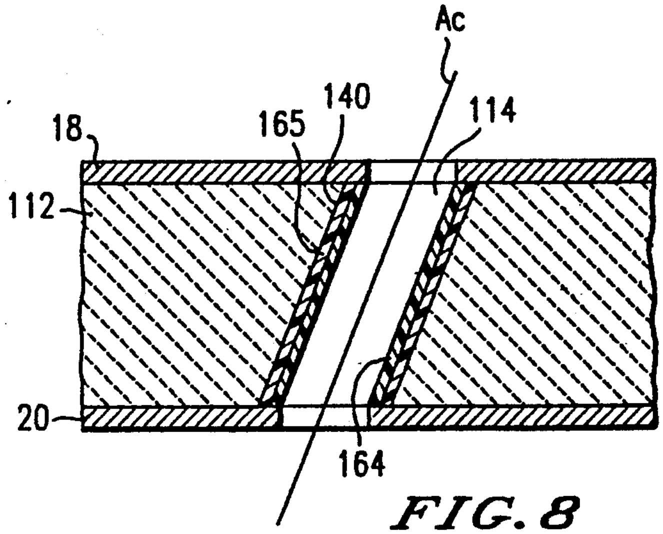
FIG. 8 is a fragmentary detail of a MCP according to the present invention having an alkali lead silicate substrate having been etched in accordance with the teachings of the present invention.

Alternatively, as shown in FIG. 8, the substrate 112 may be a multicomponent dielectric material such as alkali lead silicate glass which has been anisotropically etched in accordance with the teachings of the present invention to produce microchannels 114 therein. Thereafter, the etched substrate 112 may be first subjected to a wet-etch with a weak acid to deplete the lead from the glass adjacent the channel walls 114 and then be hydrogen reduced in order to produce a continuous dynode 140 with a semiconductive layer 165 in the substrate 112 and an emissive surface 164 as shown.

Figure 9A:
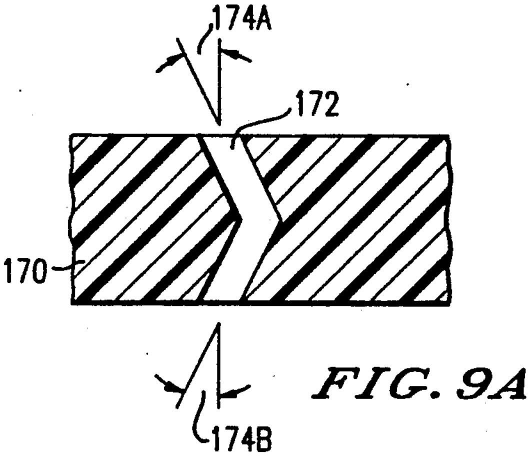
FIG. 9A-9F illustrate in fragmentary detail various embodiments of the present invention.
Figure 9B:
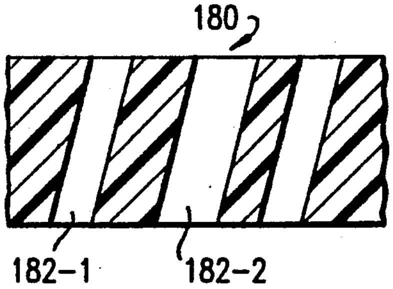
Figure 9C:
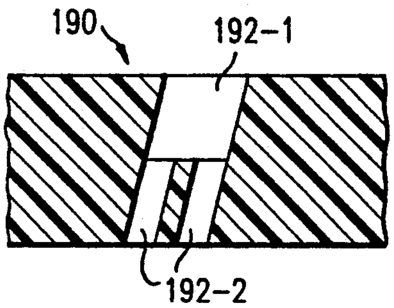
Figure 9D:
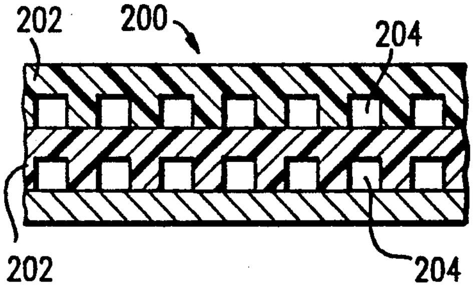
Figure 9E:
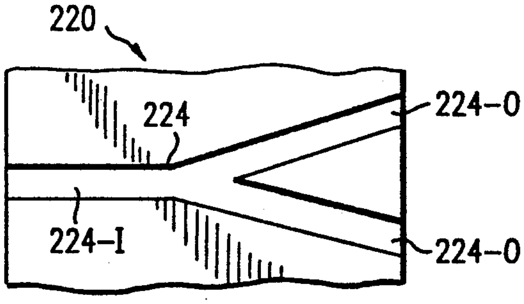
Figure 9F:
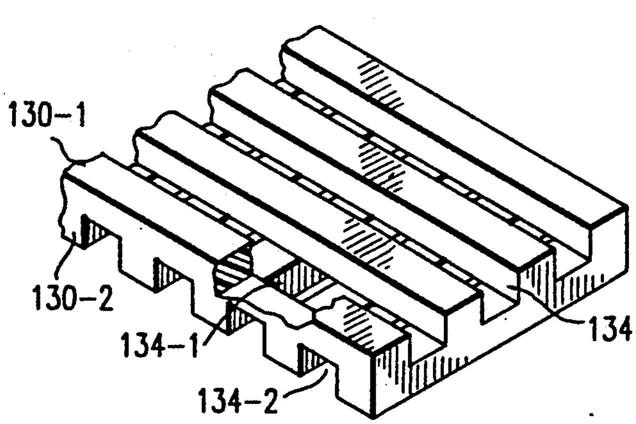

Other variations of the present invention are also possible. For example, it may be possible to perform the etching step through the substrate from both sides at the same bias angle and at the same time or sequentially in order to produce straight microchannels in the configuration illustrated in FIG. 4. It may also be possible to perform the etching step from each side at different bias angles in order to produce microchannels 172 entering the plate 170 at a first bias angle 174A and leaving the plate at a second bias angle 174B in a monolithic structure (FIG. 9A). It is also possible to produce a microchannel plate 180 having individual channels 182-1, 182-2 which are of various sizes (FIG. 9B). For example, small and large channels may be arranged in a pattern or matrix. It is further possible to produce a MCP 190 with an arrangement of microchannels such that a single relatively large channel 192-1 is interconnected with one or more relatively smaller channels 192-2 in a monolithic structure (FIG. 9C). It is also possible to form an electron multiplier having one or more elongated trenches 204 in a single substrate 202 or alternatively in a stack of such substrates together in side-by-side configuration to form a laminated microchannel structure 200 (FIG. 9D). It is also possible to form an electron multiplier 220 with branched trenches 224 in which the input end 224-I is a single trench and the output has branched channels 224-O each of which forms a separate and distinct output which may be individually read or controlled (FIG. 9E). In yet another embodiment of the invention it may be possible to form a wafer 130 having trenched channels 134-1 . . . 134-2 formed in opposite sides 131-1 and 131-2 in which the trenched channels 134-1 . . . 134-2 are oriented so that they are related to the other cross-wise in order to form a pseudo channel matrix (FIG. 9F).

Further, processing of the channels which are formable in accordance with the present invention may be staged so that the coatings or the dynode surfaces exhibit different characteristics. For example, it is possible to form a channel in a plate by etching to a selected depth in the substrate and thereafter applying conductive and emissive films. In subsequent etching steps the channel may be formed to an increased depth within the wafer and additional coatings may be applied such that the conductivity or emissivity of the dynode thus produced varies lengthwise of the channel and in a stepwise or graded fashion. Alternatively, each branch of a channel may be individually treated after it is formed in order to provide a branched channel arrangement with different electron multiplication properties at each output.

In accordance with the present invention, because the substrate may be anisotropically etched in order to produce an apertured microchannel plate, a number of the processing steps associated microchannel plate manufacture by the GMD process are eliminated. Accordingly, some of the constraints in the properties of suitable substrate materials are significantly relaxed thereby allowing greater latitude in substrate materials selected. In addition, the materials properties necessary for the manufacture of microchannel plate substrates may be divorced or decoupled from the materials properties necessary for the production of continuous dynodes.

As a direct result of the present invention, smaller channel diameters, or widths less than about 4 μm and pitch, less than about 6 μm may be achieved thereby resulting in improved spatial and temporal characteristics (e.g. resolution and speed). The channel and pitch dimensions are better than can be achieved with the conventional GMD processes or methods employing photosensitive glass. Exemplary film thicknesses are about 2–20 nm for electron-emissive films and about 10–1000 nm for current-carrying films and are achievable with CVD, LPD and growth by reactive techniques such as set forth in Tasker et al., Ser. No. 395,588 filed Aug. 18, 1989, the teachings of which are incorporated herein by reference. Other significant advantages of the invention include the ability to fabricate periodic arrays for advanced address/readout schemes and areal arrays of microchannels with relatively large linear dimensions. Reduction or elimination of fixed pattern defects caused by variation of channel diameter is also achieved. The ability to select substrate materials based upon physical properties other than formability allows greater design flexibility. For example, higher operating temperatures may be achieved by use of refractory substrates. A thermally conductive substrate allows more efficient dissipation of Joule heat and thus may lead to greater thermal stability. Improved noise characteristics and dynamic range by use of high-purity substrate materials also results.

While the invention has been described in connection with specific embodiments thereof, it will be understood that it is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A method for manufacturing a microchannel plate comprising the steps of:

forming a body of etchable material;

directionally applying a flux of reactive particles against the body in selected areas corresponding to microchannel locations for removing material from the selected areas to produce microchannels in the body aligned in accordance with the directionality of the applied flux; and activating the microchannels by forming a continuous thin film dynode of less than 1,000 nm to exhibit secondary electron emissivity.

2. The method of claim 1 wherein the body is a wafer and the flux is applied against at least one face of said wafer.

3. The method of claim 2 wherein the flux is applied to the wafer for a time sufficient to extend the channels through the wafer from at least one face to the other.

4. The method of claim 1 further comprising the step of establishing communication between sides of the body through the microchannels.

5. The method of claim 1 wherein the flux is applied to the wafer for a time sufficient to produce said microchannels to a desired depth in the body.

6. The method of claim 5 further comprising the step of establishing communication between the faces of the body by removing a portion of the face of the body opposite the face against which the flux is applied to expose the ends of the channels within the body.

7. The method of claim 1 further including depositing electrode material on at least one of the faces of the body.

8. The method of claim 1 wherein the step of applying the flux in selected areas includes the step of applying an etch mask to said body for establishing the selected areas.

9. The method of claim 8 wherein the etch mask is a selectively exposed photopolymer.

10. The method of claim 8 wherein the etch mask is an etch resistant apertured metal.

11. The method of claim 8 wherein the etch mask is an etch resistant apertured oxide or nitride.

12. The method of claim 1 wherein the step of activating the microchannels includes forming a secondary emissive layer on the walls of the microchannels.

13. The method of claim 1 wherein the step of activating the microchannels comprises forming a current carrying layer in the walls of the microchannels.

14. The method of claim 1 wherein the step of activating the channels is accomplished by a chemical vapor deposition step.

15. The method of claim 1 wherein the step of activating the channels is accomplished by reaction with a reactive species.

16. The method of claim 1 wherein the step of activating the channels is accomplished by a liquid phase deposition step.

17. The method of claim 1 wherein the step of activating the microchannels includes selecting a substrate material which exhibits secondary emissivity when subjected to a flux reactive species.

18. The method of claim 1 wherein the flux is a direction specific agent.

19. The method of claim 1 wherein the flux is an ion beam.

20. The method of claim 1 wherein the flux is generated by a glow discharge.

21. The method of claim 1 wherein the flux is a plasma assisted ion beam.

22. The method of claim 1 wherein the substrate is a semiconductor.

23. The method of claim 22 wherein the semiconductor is a material selected from the group consisting of: GaAs, GaP, InP, AlAs, AlSb and Si.

24. The method of claim 1 wherein the substrate is a single component dielectric.

25. The method of claim 24 wherein the dielectric is a material selected from the group consisting of: $Si_3N_4$, AlN, $Al_2O_3$ and $SiO_2$ glass.

26. A method for manufacturing an electron multiplier comprising forming a body of etchable material, directionally applying a flux of reactive particles against the body in selected areas for removing material therefrom in order to form at least one electron multiplication channel in the body suitable for receiving a thin film dynode of less than 1,000 nm.

* * * * *

UNITED STATES PATENT AND TRADEMARK OFFICE
CERTIFICATE OF CORRECTION

PATENT NO. : 5,205,902

DATED : April 27, 1993

INVENTOR(S) : Horton et al

It is certified that error appears in the above-identified patent and that said Letters Patent is hereby corrected as shown below:

In the Abstract:
line 2 delete "water" insert --wafer--.

Column 1, line 29 delete "produces" insert --produce--.
line 42 delete "an" insert --a--.
line 55 delete "longrange" insert --long-range--.

Column 4, line 3 delete "$C_3$" insert --Cs--.
line 10 delete ":".
line 49 delete "fcorming" insert --forming--.

Column 5, line 16 after "sputtering" insert --,--.
line 56 after "field" insert --ε--.
line 58 after "electrons" insert --e--.
line 59 after "noise" insert --by--.

Column 6, line 51 delete "131-1 and 131-2" insert --130-1 and 130-2--.

UNITED STATES PATENT AND TRADEMARK OFFICE
CERTIFICATE OF CORRECTION

PATENT NO. : 5,205,902

DATED : April 27, 1993

INVENTOR(S) : Horton et al

It is certified that error appears in the above-indentified patent and that said Letters Patent is hereby corrected as shown below:

Column 7, line 64 after "of" insert --thickness--.

Column 8, line 7 delete "1" insert --2--.
Line 14 delete "1" insert --2--.
line 28 after "secondary" insert --electron--.
line 31 delete "in" insert --on--.
lines 33, 36 and 39 delete "channels" insert --microchannels--.
line 42 after "secondary" insert --electron--.
line 43 after "flux" insert --of--.
lines 52 and 57 delete "substrate" insert --body--.
line 67 after "of" insert --thickness--.

Signed and Sealed this

First Day of March, 1994

Attest:

Bruce Lehman

BRUCE LEHMAN

*Attesting Officer*

*Commissioner of Patents and Trademarks*